(12) United States Patent
Cao et al.

(10) Patent No.: US 9,848,495 B2
(45) Date of Patent: Dec. 19, 2017

(54) IMPERMEABLE PROTECTIVE COATINGS THROUGH WHICH ELECTRICAL CONNECTIONS MAY BE ESTABLISHED AND ELECTRONIC DEVICES INCLUDING THE IMPERMEABLE PROTECTIVE COATINGS

(71) Applicant: HZO, Inc., Draper, UT (US)

(72) Inventors: Liulei Cao, Salt Lake City, UT (US); Tining Su, Draper, UT (US); Yang Yun, Draper, UT (US)

(73) Assignee: HZO, Inc., Draper, UT (US)

( * ) Notice: Subject to any disclaimer, the term of this patent is extended or adjusted under 35 U.S.C. 154(b) by 64 days.

(21) Appl. No.: 14/740,211

(22) Filed: Jun. 15, 2015

(65) Prior Publication Data

US 2015/0366097 A1 Dec. 17, 2015

Related U.S. Application Data

(60) Provisional application No. 62/012,267, filed on Jun. 13, 2014.

(51) Int. Cl.
*H05K 3/28* (2006.01)
*H05K 3/34* (2006.01)

(52) U.S. Cl.
CPC .............. *H05K 3/284* (2013.01); *H05K 3/285* (2013.01); *H05K 3/341* (2013.01); *H05K 2201/0191* (2013.01); *H05K 2201/10977* (2013.01); *H05K 2203/0759* (2013.01); *Y02P 70/613* (2015.11)

(58) Field of Classification Search
CPC ........... H05K 3/282; H05K 2201/0191; H05K 2201/10977; H05K 3/284; H05K 2203/0759
See application file for complete search history.

(56) References Cited

U.S. PATENT DOCUMENTS

| 6,900,383 | B2 * | 5/2005 | Babb ..................... H01L 23/552 174/394 |
| 2009/0263581 | A1 * | 10/2009 | Martin, III .......... C23C 14/0647 427/255.395 |
| 2013/0176700 | A1 * | 7/2013 | Stevens ................... H05K 1/185 361/760 |
| 2013/0251889 | A1 * | 9/2013 | Cox ........................ C23C 16/02 427/58 |
| 2013/0286567 | A1 * | 10/2013 | Sorenson ................ C23C 16/02 361/679.01 |
| 2013/0335898 | A1 * | 12/2013 | Stevens .................. H05K 13/00 361/679.01 |
| 2014/0160650 | A1 * | 6/2014 | Stevens .................. H05K 13/00 361/679.01 |
| 2015/0366097 | A1 * | 12/2015 | Cao ........................ H05K 3/341 361/757 |

* cited by examiner

*Primary Examiner* — Michael A Salvitti
(74) *Attorney, Agent, or Firm* — Kunzler Law Group

(57) ABSTRACT

Protective coatings are disclosed that are configured to cover electronic components within an electronic device, while enabling electrical connections to be established with electrical contacts that are covered by the protective coatings. Such a protective coating may comprise a parylene, or a poly(p-xylylene), protective coating that has a thickness of at least 0.1 μm and at most about 2 μm. Electronic devices that include such a protective coating are also disclosed.

21 Claims, 1 Drawing Sheet

IMPERMEABLE PROTECTIVE COATINGS THROUGH WHICH ELECTRICAL CONNECTIONS MAY BE ESTABLISHED AND ELECTRONIC DEVICES INCLUDING THE IMPERMEABLE PROTECTIVE COATINGS

CROSS-REFERENCE TO RELATED APPLICATION

A claim for priority to the Jun. 13, 2014, filing date of U.S. Provisional Patent Application 62/012,267, titled IMPERMEABLE PROTECTIVE COATINGS THROUGH WHICH ELECTRICAL CONNECTIONS MAY BE ESTABLISHED AND ELECTRONIC DEVICES INCLUDING THE IMPERMEABLE PROTECTIVE COATINGS ("the '267 Provisional Application) is hereby made pursuant to 35 U.S.C. §119(e). The entire disclosure of the '267 Provisional Application is hereby incorporated herein.

TECHNICAL FIELD

This disclosure relates generally to protective coatings that are configured to cover electronic components within an electronic device and, more specifically, to protective coatings through which electrical connections may be made without the requirement of masks or other features that prevent the material of a protective coating from being deposited onto a substrate. Even more specifically, this disclosure relates to parylene, or poly(p-xylylene), coatings that have thicknesses of about 2 µm or less, and to electronic devices that include such coatings.

RELATED ART

Due to the ever-increasing portability and use of portable electronic devices, their relatively high cost and their increased use in environments where they may be exposed to and risk damage from water and other contaminants, efforts have been made to limit exposure of water-sensitive components within electronic devices to water and other contaminants. One approach, which has been taken by companies like P2i Ltd of Abingdon, Oxfordshire, United Kingdom, Liquipel, LLC of Santa Ana, Calif., and Europlasma NV of Oudenaarde, Belgium, has been to apply an ultra-thin film of hydrophobic material, by way of plasma-enhanced chemical vapor deposition (PECVD) processes onto components within the interiors of electronic devices. While this approach has proven somewhat useful for repelling water or other liquids that are splashed onto electronic devices, it provides little or no protection against immersion of a "protected" electronic device into a quantity of liquid (e.g., water, etc.). The liquid typically comes into contact with exposed electrically conductive features within the "protected" electronic device and causes electrical shorts that often damage the electronic device.

HZO, Inc., has developed technology that enables water impermeable protective coatings to be applied to electronic components within electronic devices, and to provide the electronic devices with prolonged protection as they are immersed or submerged in a liquid such as water. More specifically, the technology that HZO has developed relates to the application of parylene coatings to water-sensitive electronic components within electronic devices. In an effort to provide highly reliable protection against water and other types of moisture, relatively thick (e.g., about 4 µm thick to about 10 µm thick, about 7 µm thick, etc.) parylene coatings are deposited onto electronic components within the interiors of electronic devices. Because of the thicknesses of these coatings, time-consuming masking or material removal processes are typically needed to ensure that electrical contacts are exposed so electrical connections may subsequently be made with the electrical contacts.

DISCLOSURE

Figure 1:
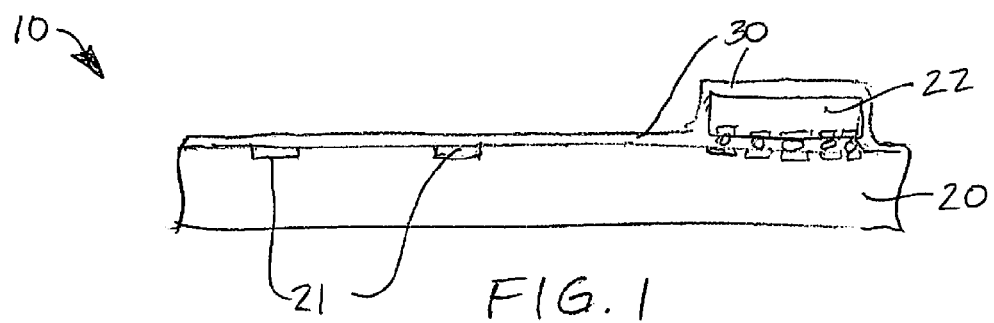
FIG. 1 schematically illustrates an embodiment of an electronic device assembly, as well as a protective coating according to this disclosure, which covers at least a portion of the electronic device assembly, including one or more electrical contacts of the electronic device assembly.

This disclosure relates to protective coatings that provide a desirable level of protection against water and other types of moisture while enabling electrical connections to be readily made through the protective coatings. Electrical connections may be made through a protective coating according to this disclosure without the requirement of masking processes before applying the protective coating to all or part of an electronic device assembly, without requiring that masks be removed after the protective coating has been applied and/or without requiring that portions of the protective coating that overlie electrical contacts be removed before electrical contacts can be established.

As used herein, the term "protective coating" includes moisture resistant coatings or films, as well as other coatings or films that protect various parts of an electronic assembly from moisture and/or other external influences. While the term "moisture resistant coating" is used throughout this disclosure, in many, if not all, circumstances, a moisture resistant coating may comprise or be substituted with a protective coating that protects coated components and/or features from other external influences. The term "moisture resistant" refers to the ability of a coating to prevent exposure of a coated element or feature to moisture. A moisture resistant coating may resist wetting or penetration by one or more types of moisture, or it may be impermeable or substantially impermeable to one or more types of moisture. A moisture resistant coating may repel one or more types of moisture. In some embodiments, a moisture resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.), wetness, etc.). Use of the term "moisture resistant" to modify the term "coating" should not be considered to limit the scope of materials the coating protects against. The term "moisture resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components.

In various embodiments, a protective coating according to this disclosure comprises a film with a thickness that provides a desired level of impermeability to water and/or oxygen, but that enables electrical connections to be readily established therethrough. In some embodiments, such "connect through" may be achieved with conventional electrical coupling techniques, such as soldering or wire bonding. Optionally, when a protective coating according to this disclosure has been applied to an electronic device assembly, connect through may achieved by way of the friction that is generated as two electrical connectors are coupled to one another; e.g., by way of an interference fit, etc.

In more specific embodiments, the protective coating may comprise a parylene, which may include an unsubstituted poly(p-xylylene), a halogenated poly(p-xylylene) or the like. Such a protective coating may have a thickness of about 2 µm or less (e.g., about 1.5 µm or less, about 1.25 µm or less, about 1 µm or less, etc.). The thickness of such a protective coating may be at least about 0.1 µm, at least about 0.5 µm, etc. In some embodiments, a protective coating may have a thickness of about 0.5 µm to about 1.25 µm or, more broadly, a thickness of about 0.1 µm to about 2 µm.

A measure of the thickness of a protective coating may comprise an average thickness of the protective coating, a maximum thickness of the protective coating or a minimum thickness of the protective coating. By way of example, when a protective coating has a thickness of 1.25 µm, the average thickness of the coating may be 1.25 µm, the maximum thickness of the protective coating may be 1.25 µm or the minimum thickness of the protective coating may be 1.25 µm.

In some embodiments, a protective coating, or layer, according to this disclosure may be confluent or substantially confluent (accounting for small voids, etc.). A confluent layer may provide a water-impermeable barrier. A confluent layer of parylene C having a thickness of about 0.1 µm to about 1 µm may have an oxygen transfer rate (OTR) of about $1 \times 10^4$ (cc×mm)/(m²×day×atm), a water contact angle of 95% and a water vapor transfer rate (WVTR) of about 1 g/(100 in.²×day). The WVTR of such a protective coating, and its substantial conformality may impart it with an IP 100 Water Inject Flow Test rating of IPX7, which means that an electronic device or an electronic device assembly that is covered by such a protective coating may, on average, be protected from water immersions at depths of one meter for durations of 30 minutes.

In other embodiments, the layer may be non-confluent (i.e., it may comprise voids or other openings that enable moisture to pass therethrough).

Such a layer may be deposited onto an electronic device assembly in a manner known in the art. As used herein, "electronic device assembly" refers to an assembly of electronic device components. One example of an electronic device assembly includes a printed circuit board and electrical components (e.g., semiconductor devices, etc.) that have been electrically coupled thereto; for example, by surface mount processes. As another example, an electronic device assembly may include an assembly of electronic components, such as a printed circuit board and one or more electronic components that are electrically coupled to the printed circuit board, but not carried by the printed circuit board. In yet another example, an electronic device assembly may comprise partially or fully assembled electronic device (e.g., a portable electronic device, an electronic device that is configured for use in which moisture is likely to be present, a medical electronic device, etc.), which may include at least part of a housing.

A deposition apparatus that includes features such as those disclosed by U.S. Patent Application Publication Nos. US 2013/0251889 A1 and US 2013/0286567 A1 of HZO, the entire disclosures of both of which are hereby incorporated by reference, may be used to deposit a protective coating according to this disclosure onto at least one electronic device assembly, or simultaneously onto a large number of electronic device assemblies. When such equipment is used, the protective coating may be applied in about ninety (90) minutes or less, in about sixty (60) minutes to about ninety (90) minutes, or in about sixty (60) minutes or less.

The protective coating may be applied to the electronic device assembly as part of an assembly process (e.g., after surface mount processing; as part of an assembly line; off-line before or after electronic components with a printed circuit board; etc.) while manufacturing an electronic device, as disclosed by U.S. Patent Application Publication US 2013/0286567 A2 of HZO, the entire disclosure of which is hereby incorporated herein, or as part of a refurbishing process or a remanufacturing process, as disclosed by U.S. Patent Application Publications US 2013/0335898 A1 and US 2014/0160650 A1 of HZO, the entire disclosures of both of which are hereby incorporated herein.

In another aspect, electronic device assemblies and electronic devices that include protective coatings according to this disclosure are within the scope of this disclosure. As illustrated by FIG. 1, a protective coating 30 may cover portions of two or more electronic components 20, 22 of the electronic device assembly 10 or the electronic device, as well as electrical coupling elements 40 between the two or more electronic components 20, 22. An electronic device produced by such a process may be configured in the manner disclosed by U.S. Patent Application Publication 2013/0176700 A1 of HZO, the entire disclosure of which is hereby incorporated by reference. Since connect through is possible with a protective coating 30 according to this disclosure, the protective coating 30 may be applied to an electronic device assembly 10 without first masking the electronic device assembly 10. Thus, the protective coating 30 may substantially cover (i.e., accounting for possible voids, etc.) or completely cover a surface of one or more components 20, 22 of an electronic device assembly 10 or a surface of an electronic device assembly.

Figure 2:
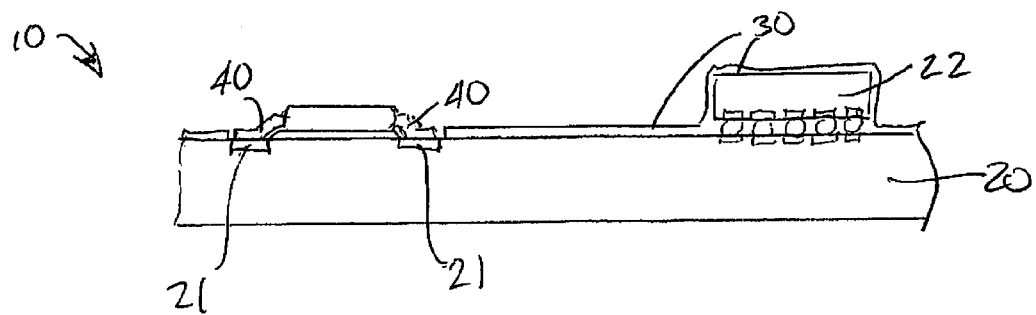
FIG. 2 schematically illustrates the embodiment of electronic device assembly shown in FIG. 1, with at least one electrical coupling element extending through the protective coating and electrically coupled to the contact.

With a protective coating 30 according to this disclosure in place on one or more components 20, 22 of an electronic device assembly 10 and, thus, with the protective coating 30 in place on the electronic device assembly 10, a connect through process may be conducted. As indicated previously herein, the phrase "connect through" may refer to an electrical coupling process that occurs through the protective coating 30. Without limitation, electrical coupling elements 40 may be electrically coupled to contact pads 21, 23 (e.g., terminals, bond pads, etc.) that are covered by a protective coating 30 according to this disclosure. Some non-limiting examples of electrical coupling elements 40 that may connect through a protective coating 30 include solder joints, wire bonds, thermocompression bonds (as illustrated by FIG. 2), piercing connectors and other conductive elements that may be heated and/or forced through the relatively thin protective coating 30. Electrical coupling elements that establish communication by making interference-type contact with one another (e.g., in mating connectors that plug into one another, etc.) may also be connected to one another through a protective film 30 according to this disclosure. Other techniques for establishing electrical connections may also be used to connect through a protective film according to this disclosure.

The electronic device assemblies that result from establishing electrical connections through a protective coating according to this disclosure are also within the scope of the disclosure. Such an electronic device assembly 10, an embodiment of which is schematically depicted by FIG. 2, includes one or more components 20, 22 that are at least partially covered by a protective coating 30 according to this disclosure. In some embodiments, the protective coating 30 may substantially or completely cover an entire surface of the component(s) 20, 22 and/or the electronic device assembly 10. An electrical coupling element 40 (e.g., an electrical contact, a solder structure, a bond wire, etc.) may extend through the protective coating 30 and be electrically coupled with a contact 21, 22 that was previously beneath the protective coating 30. In some embodiments, an outer periphery of an electrical coupling element 40 may be spaced apart from edges of the protective coating 30 that are formed as the connect through process occurs. In some embodiments, the edges that are formed in the protective coating 30 during connect through may comprise thickened regions that at least partially surround, and may contact, adjacent portions of the electrical coupling element 40 that now extends through the protective film 30. It should be noted that FIG. 2 is merely illustrative of the results of a connect through process, and that FIG. 2 should not limit the types of electrical connections that may be established through a protective film 30 according to this disclosure.

Other aspects, as well as features and advantages of various aspects, of the disclosed subject matter will become apparent to those of ordinary skill in the art through consideration of the preceding disclosure. Although the preceding disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. An electronic device, comprising:
   a housing defining an interior of the electronic device;
   at least one printed circuit board within the interior of the electronic device;
   a plurality of electronic components assembled with but not carried by the at least one printed circuit board;
   an electrical coupling element;
   at least one coating comprising a poly(p-xylylene) on at least portions of the at least one printed circuit board and the plurality of electronic components, the at least one coating being thin enough at one of the plurality of electronic components to enable electrical connection to be made therethrough; and
   an established electrical connection between the one of the plurality of electronic components and the electrical coupling element through the coating, the at least one coating covering a surface of the one of the plurality of electronic components and positioned between the one of the plurality of electronic components and the electrical coupling element.

2. The electronic device of claim 1, wherein the at least one coating has a thickness of no greater than two microns.

3. The electronic device of claim 2, wherein the thickness is an average thickness across an entire area of the at least one coating.

4. The electronic device of claim 2, wherein the thickness is a maximum thickness.

5. The electronic device of claim 2, wherein the at least one coating has a thickness of at least about 0.1 μm.

6. The electronic device of claim 5, wherein the at least one coating has a thickness of about 0.5 μm to about 1.25 μm.

7. The electronic device of claim 5, wherein the thickness is an average thickness across an entire area of the at least one coating.

8. The electronic device of claim 5, wherein the thickness is a minimum thickness.

9. The electronic device of claim 1, wherein the thickness of the at least one coating is sufficient to provide a confluent, water-impermeable barrier.

10. The electronic device of claim 1, where the at least one coating is not confluent.

11. The electronic device of claim 1, wherein the thickness of the at least one coating is thin enough to enable solder connections, wire bonds, and plug-in type connections to remove material from contacts covered by the at least one coating.

12. An electronic device, comprising:
    a housing defining an interior of the electronic device;
    at least one printed circuit board within the interior of the electronic device;
    a plurality of electronic components assembled with but not carried by the at least one printed circuit board;
    an electrical coupling element;
    at least one coating comprising a poly(p-xylylene) on at least portions of the at least one printed circuit board and the plurality of electronic components, the at least one coating comprising a non-confluent coating thin enough at one of the plurality of electronic components to enable electrical connection to be made therethrough; and
    an established electrical connection between the one of the plurality of electronic components and the electrical coupling element through the coating, the at least one coating covering a surface of the one of the plurality of electronic components and positioned between the one of the plurality of electronic components and the electrical coupling element.

13. The electronic device of claim 12, wherein the at least one coating has a thickness of no greater than two microns.

14. The electronic device of claim 13, wherein the thickness is a maximum thickness.

15. The electronic device of claim 12, wherein the thickness of the at least one coating is thin enough to enable solder connections, wire bonds, and plug-in type connections to remove material from contacts covered by the at least one coating.

16. A method for protecting an electronic device, comprising:
    obtaining access to an interior of an electronic device;
    applying a coating comprising a poly(p-xylylene) to a plurality of electronic components exposed to the interior of the electronic device and to at least one electrical contact within the interior of the electronic device; and
    establishing at least one electrical connection with the at least one electrical contact, through the coating, to an electrical coupling element, the coating covering a surface of the at least one electrical contact and positioned between the at least one electrical contact and the electrical coupling element.

17. The method of claim 16, wherein applying the coating comprises applying the coating to at least one contact pad.

18. The method of claim 17, wherein establishing at least one electrical connection comprises forming a solder bond or a wire bond on the at least one contact pad.

19. The method of claim 16, wherein applying the coating comprises applying the coating to at least one contact of an electrical coupling element of the electronic device.

20. The method of claim 19, wherein establishing at least one electrical connection comprises coupling a complementary electrical coupling element to the electrical coupling element.

21. The method of claim 20, wherein friction between the at least one contact of the electrical coupling element and a corresponding contact of the complementary electrical coupling element establishes the at least one electrical connection.

\* \* \* \* \*